(12) United States Patent
Furihata et al.

(10) Patent No.: US 7,175,960 B2
(45) Date of Patent: Feb. 13, 2007

(54) POSITIVE RESIST COMPOSITION AND PATTERNING PROCESS

(75) Inventors: Tomoyoshi Furihata, Gunma-ken (JP); Hideto Kato, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/936,621

(22) Filed: Sep. 9, 2004

(65) Prior Publication Data

US 2005/0058937 A1    Mar. 17, 2005

(30) Foreign Application Priority Data

Sep. 12, 2003    (JP) .............................. 2003-321824

(51) Int. Cl.
*G03F 7/023* (2006.01)
*G03F 7/30* (2006.01)

(52) U.S. Cl. ..................... 430/190; 430/191; 430/192; 430/193; 430/326

(58) Field of Classification Search ................ 430/190, 430/191, 192, 193, 326
See application file for complete search history.

(56) References Cited

U.S. PATENT DOCUMENTS

| | | | |
|---|---|---|---|
| 5,738,968 A | 4/1998 | Hosoda et al. | |
| 6,210,855 B1 * | 4/2001 | Ueda et al. | 430/190 |
| 6,773,858 B2 * | 8/2004 | Kato et al. | 430/190 |
| 6,911,292 B2 * | 6/2005 | Furihata et al. | 430/190 |
| 2002/0182531 A1 | 12/2002 | Mizuta et al. | |

FOREIGN PATENT DOCUMENTS

| | | |
|---|---|---|
| JP | 9-319078 A | 12/1997 |
| JP | 2002-296772 A | 10/2002 |

OTHER PUBLICATIONS

"Challenge of Intelligence for Future Break Through," Feb. 1992, p. 18-20.

* cited by examiner

*Primary Examiner*—John S. Chu
(74) *Attorney, Agent, or Firm*—Birch, Stewart, Kolasch & Birch, LLP

(57) ABSTRACT

A positive resist composition comprising a mixture of an alkali-soluble novolak resin prepared using m-cresol, p-cresol and 2,5-xylenol as starting reactants and a phenolic compound, wherein the hydrogen atoms of all hydroxyl groups are substituted in a proportion of 0.03–0.05 mol per hydrogen atom with 1,2-naphthoquinonediazidosulfonyl ester groups, has uniformity, high sensitivity and high resolution, and is improved in heat resistance, film retention, substrate adhesion, and storage stability.

6 Claims, No Drawings

POSITIVE RESIST COMPOSITION AND PATTERNING PROCESS

CROSS-REFERENCE TO RELATED APPLICATIONS

This non-provisional application claims priority under 35 U.S.C. Section 119(a) on Patent Application No. 2003-321824 filed in Japan on Sep. 12, 2003, the entire contents of which are incorporated herein by reference.

TECHNICAL FIELD

This invention relates to a positive resist composition comprising a mixture of a novolak resin and a phenolic compound wherein some of the hydrogen atoms of all hydroxyl groups are substituted with 1,2-naphthoquinonediazidosulfonyl ester groups, and a patterning process using the same.

BACKGROUND ART

In the field of advanced hard disk drives which are increased in recording density, it is desired to have a resist material capable of forming an isolated micropattern having a film thickness of 3 to 6 μm and a line width spacing of equal to or less than 0.5 μm. In the prior art, novolak base resist materials are prepared using two main components, a novolak resin and a photosensitive agent. The resist materials which meet the above requirement should have a higher sensitivity and resolution, improved pattern shape, heat resistance, film retention, substrate adhesion and storage stability as well as being adaptable to the wavelength of the light source in any exposure device. To this end, a number of designs have been proposed for the novolak resin, photosensitive agent and solvent.

Referring to the novolak resin, it is known from BREAK THROUGH, February 1992, page 18 that as the average molecular weight of a novolak resin being synthesized is reduced, the resolution is improved, but the heat resistance and film retention become poorer. It was then proposed to treat the novolak resin by a reprecipitation method for removing lower molecular weight fractions from the novolak resin. Also, JP-A 2002-296772 discloses a positive resist composition comprising a novolak resin in which some phenolic hydroxyl groups are substituted with 1,2-naphthoquinonediazidosulfonyl ester groups, a 1,2-naphthoquinonediazidosulfonyl ester of a polynuclear phenolic monomer, and a sensitizer. This positive resist composition is fully effective for forming a whole pattern at a film thickness of up to 1 μm, but lacks a high sensitivity and revolution sufficient to form an isolated pattern of thick film having a line width spacing of up to 0.5 μm.

With respect to the sensitizer, a positive resist composition comprising an alkali soluble resin, a quinonediazido group-containing compound, and a certain hydroxy compound was proposed in JP-A 9-319078 for achieving a high sensitivity and resolution and improving the resistance to dry etching necessary for semiconductor device manufacturing process. This positive resist composition is fully effective for forming a line-and-space pattern at a film thickness of approximately 1 μm, but lacks a high revolution sufficient to form an isolated pattern of thick film having a line width spacing of up to 0.5 μm.

SUMMARY OF THE INVENTION

An object of the present invention is to provide a positive resist composition which is improved in uniformity, sensitivity, resolution, pattern shape, heat resistance, film retention, and substrate adhesion when used as a material to form an isolated micropattern having a line width spacing of up to 0.5 μm at a resist film thickness of 3 to 6 μm; and a patterning process using the same.

The inventor has discovered that a positive resist composition comprising as a base resin a mixture of an alkali-soluble novolak resin and a phenolic compound wherein the hydrogen atoms of all hydroxyl groups are substituted in a proportion of 0.03 to 0.05 mol per hydrogen atom with 1,2-naphthoquinonediazidosulfonyl ester groups is improved in uniformity, sensitivity, resolution, pattern shape, heat resistance, film retention, and substrate adhesion when used as a material to form an isolated micropattern having a line width spacing of up to 0.5 μm at a resist film thickness of 3 to 6 μm.

Accordingly, one embodiment of the present invention is a positive resist composition comprising as a base resin a mixture of an alkali-soluble novolak resin comprising recurring units of the structural formula (1) and a phenolic compound of the structural formula (2), wherein the hydrogen atoms of all hydroxyl groups are substituted in a proportion of 0.03 to 0.05 mol per hydrogen atom with 1,2-naphthoquinonediazidosulfonyl ester groups.

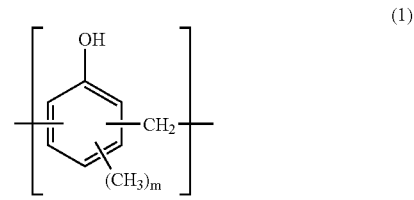

(1)

Herein m is an integer of 0 to 3.

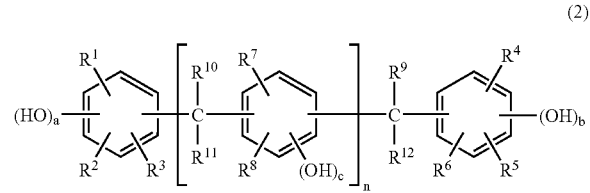

(2)

Herein $R^1$ to $R^8$ are each independently hydrogen, a straight, branched or cyclic alkyl group having 1 to 6 carbon atoms, or a straight, branched or cyclic alkoxyl group having 1 to 6 carbon atoms, $R^9$ to $R^{11}$ are each independently hydrogen or a straight, branched or cyclic alkyl group having 1 to 6 carbon atoms, $R^{10}$ and $R^{11}$, taken together, may form a ring with the carbon atom to which they are bonded, $R^{12}$ is hydrogen, a straight alkyl group having 1 to 6 carbon atoms, or a group of the formula (3):

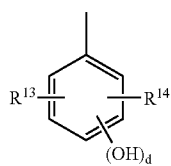

(wherein $R^{13}$ and $R^{14}$ are each independently hydrogen, a straight, branched or cyclic alkyl group having 1 to 6 carbon atoms, or a straight, branched or cyclic alkoxyl group having 1 to 6 carbon atoms, d is an integer of 1 to 3), $R^{12}$ and $R^9$, taken together, may form a ring of 3 to 6 carbon atoms with the carbon atom to which they are bonded, a and b each are an integer of 1 to 3, c is an integer of 0 to 3, and n is an integer of 0 to 3.

Another embodiment of the present invention is a patterning process comprising the steps of (i) applying the positive resist composition onto a substrate, (ii) exposing the applied resist through a photomask to light having a wavelength of 150 to 450 nm, and (iii) developing the exposed resist with a liquid developer.

The positive resist composition of the invention, when used in microfabrication, has uniformity, a high sensitivity, and a high resolution, is improved in pattern shape and resolution when forming a pattern having a line width spacing of up to 0.5 μm at a resist film thickness of at least 3 μm, and exhibits satisfactory heat resistance, film retention, substrate adhesion, and storage stability.

PREFERRED EMBODIMENTS OF THE INVENTION

The positive resist composition of the invention comprises a mixture of an alkali-soluble novolak resin comprising recurring units of the structural formula (1) and a phenolic compound of the structural formula (2), wherein the hydrogen atoms of all hydroxyl groups are substituted in a proportion of 0.03 to 0.05 mol per hydrogen atom with 1,2-naphthoquinonediazidosulfonyl ester groups.

The alkali-soluble novolak resin used herein has recurring units of the structural formula (1):

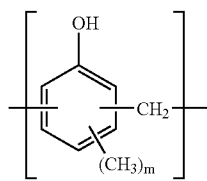

wherein m is an integer of 0 to 3.

The alkali-soluble novolak resin comprising recurring units of the structural formula (1) may be prepared by using one or more of p-cresol, m-cresol and 2,5-xylenol (or p-xylenol) as a starting reactant and reacting it with an aldehyde such as formaldehyde in the presence of a polycondensation catalyst such as oxalic acid.

Where more than one starting reactant is used, the blending proportion of the reactants is preferably set as follows. When p-cresol and m-cresol are used, the molar ratio of p-cresol/m-cresol is from 70/30 to 80/20, and when p-xylenol is additionally used, the molar ratio of (p-cresol+m-cresol)/p-xylenol is from 75/25 to 95/5. The molar ratio of formalin to phenols (F/C) is preferably from 0.3 to less than 1.0, and more preferably from 0.5 to 0.85. Too high a F/C ratio can lead to a novolak resin which will gel and become insoluble in a resist solvent.

In the practice of the invention, from the polycondensation product thus obtained, a resin having a weight average molecular weight (Mw) of 2,000 to 4,000, based on polystyrene standards, is preferably obtained by a well-known fractionation for cutting off low molecular weight fractions. A resin with a Mw of less than 2,000 tends to form a resist pattern whose cross-sectional shape is less perpendicular and have poor heat resistance. On the other hand, a resin with a Mw of more than 4,000 tends to form a resist pattern whose cross-sectional shape is less perpendicular and have a lower sensitivity. A Mw in the range of 3,100 to 3,800 is most preferred.

Also preferably, the alkali-soluble novolak resin has a dispersity, represented by weight average molecular weight/number average molecular weight (Mw/Mn), in the range of 3.0 to 5.0, especially 3.3 to 3.8. A dispersity in excess of 5.0 can form a space pattern whose top is spread and exacerbate resolution, and tends to degrade perpendicularity in cross section of a pattern. If the dispersity is reduced to less than 3.0 by substantially cutting off low molecular weight fractions through the fractionation operation, there is a tendency of sensitivity being exacerbated.

The phenolic compound used herein is of the structural formula (2).

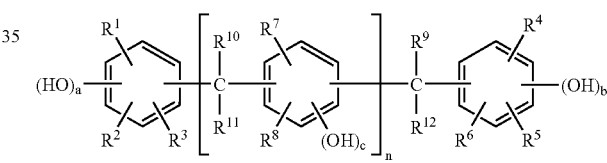

Herein $R^1$ to $R^8$ are each independently hydrogen, a straight, branched or cyclic alkyl group having 1 to 6 carbon atoms, or a straight, branched or cyclic alkoxyl group having 1 to 6 carbon atoms. $R^9$ to $R^{11}$ are each independently hydrogen or a straight, branched or cyclic alkyl group having 1 to 6 carbon atoms, and $R^{10}$ and $R^{11}$, taken together, may form a ring with the carbon atom to which they are bonded. $R^{12}$ is hydrogen, a straight alkyl group having 1 to 6 carbon atoms, or a group of the formula (3):

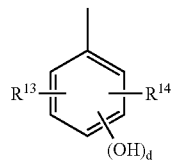

wherein $R^{13}$ and $R^{14}$ are each independently hydrogen, a straight, branched or cyclic alkyl group having 1 to 6 carbon atoms, or a straight, branched or cyclic alkoxyl group having 1 to 6 carbon atoms, and d is an integer of 1 to 3. $R^{12}$ and $R^9$, taken together, may form a ring of 3 to 6 carbon atoms with the carbon atom to which they are bonded. The subscripts a and b each are an integer of 1 to 3, c is an integer of 0 to 3, and n is an integer of 0 to 3.

Of the groups represented by $R^1$ to $R^8$, $R^{13}$ and $R^{14}$, suitable straight, branched or cyclic alkyl groups having 1 to 6 carbon atoms include methyl, ethyl, propyl, isopropyl, n-butyl, isobutyl, tert-butyl, cyclohexyl, and cyclopentyl; and suitable straight, branched or cyclic alkoxyl groups having 1 to 6 carbon atoms include methoxy, ethoxy, propoxy, isopropoxy, n-butoxy, sec-butoxy, tert-butoxy, hexyloxy, and cyclohexyloxy. Suitable straight, branched or cyclic alkyl groups having 1 to 6 carbon atoms represented by $R^9$ to $R^{11}$ and $R^{12}$ are as exemplified for $R^1$ to $R^8$, $R^{13}$ and $R^{14}$. A pair of $R^{10}$ and $R^{11}$, and a pair of $R^{12}$ and $R^9$ may bond together to form a ring of 3 to 6 carbon atoms with the carbon atom to which they are bonded.

Examples of the phenolic compound of structural formula (2) include
bis(4-hydroxy-2,3,5-trimethylphenyl)-2-hydroxyphenylmethane,
bis(2-hydroxy-3,4,6-trimethylphenyl)-2-hydroxyphenylmethane,
bis(4-hydroxy-2,3,5-trimethylphenyl)-3-hydroxyphenylmethane,
bis(4-hydroxy-2,3,5-trimethylphenyl)-4-hydroxyphenylmethane,
bis(4-hydroxy-3,5-dimethylphenyl)-3,4-dihydroxyphenylmethane,
bis(4-hydroxy-2,3,5-trimethylphenyl)-3,4-dihydroxyphenylmethane,
1-[1-(4-hydroxyphenyl)isopropyl]-4-[1,1-bis(4-hydroxyphenyl)-ethyl]benzene,
1-[1-(3-methyl-4-hydroxyphenyl)isopropyl]-4-[1,1-bis(3-methyl-4-hydroxyphenyl)ethyl]benzene,
bis(2-hydroxy-4,6-dimethylphenyl)-2-hydroxy-3-methoxyphenylmethane,
bis(2-hydroxy-4,6-dimethylphenyl)-3-hydroxy-4-methoxyphenylmethane,
bis(2-hydroxy-4,6-dimethylphenyl)-3-methoxy-4-hydroxyphenylmethane,
4,6-bis(3,5-dimethyl-4-hydroxyphenylmethyl)pyrogallol,
2,6-bis(3-methyl-4-hydroxyphenylmethyl)-4-methylphenol,
2,6-bis(3-methyl-4-hydroxyphenylmethyl)-4-ethylphenol, and
4,6-bis(3,5-dimethyl-4-hydroxyphenylmethyl)resorcin.

These phenolic compounds may be used alone or in admixture of two or more.

Preferably, 1 to 20 parts by weight, more preferably 1 to 10 parts by weight of the phenolic compound is mixed with 100 parts by weight of the alkali-soluble novolak resin. Mixing of more than 20 pbw of the phenolic compound tends to form a resist pattern which is less perpendicular in cross-sectional shape and has degraded heat resistance. Less than 1 pbw of the phenolic compound may lead to a lower sensitivity or poor resolution.

A mixture of the alkali-soluble novolak resin and the phenolic compound wherein some of the hydrogen atoms of all hydroxyl groups are substituted with 1,2-naphthoquinonediazidosulfonyl ester groups can be synthesized by esterification reaction with a 1,2-naphthoquinonediazidosulfonic acid compound. Examples of the 1,2-naphthoquinonediazidosulfonic acid compound used herein include halides of quinonediazido compounds such as 1,2-naphthoquinonediazido-4-sulfonic acid chloride and 1,2-naphthoquinonediazido-5-sulfonic acid chloride.

In the practice of the invention, a mixture of the alkali-soluble novolak resin and the phenolic compound is subjected to esterification reaction with a 1,2-naphthoquinonediazidosulfonic acid compound whereby the hydrogen atoms of hydroxyl groups present in the mixture are substituted in a proportion of 0.03 to 0.05 mol, preferably 0.03 to 0.04 mol per hydrogen atom with 1,2-naphthoquinonediazidosulfonyl ester groups. A proportion of less than 0.03 mol leads to a space pattern whose top is spread and sometimes results in film slimming and poor resolution. A proportion of more than 0.05 mol leads to a poor resolution and low sensitivity.

To achieve such a proportion of substitution, preferably 5 to 10 parts by weight, more preferably 6 to 9 parts by weight of the 1,2-naphthoquinonediazidosulfonic acid compound is reacted with 100 parts by weight of a mixture of the alkali-soluble novolak resin and the phenolic compound.

Reaction conditions may widely vary when a mixture of the alkali-soluble novolak resin and the phenolic compound is reacted with the 1,2-naphthoquinonediazidosulfonic acid compound. For example, the mixture is dissolved in a solvent such as 1,4-dioxane, tetrahydrofuran, N,N-dimethylformamide, N,N-dimethylacetamide, acetone, methyl ethyl ketone or methyl isobutyl ketone, and the reaction effected at 5 to 50° C. for about 1 to 5 hours.

The thus obtained compound is useful as a base resin in a positive resist composition. The positive resist composition of the invention is thus defined as comprising the compound as a base resin which is dissolved in a solvent.

Any desired solvent may be used herein as long as it has a sufficient solubility relative to the base resin and an applicability to form a coating. Suitable solvents include cellosolve solvents such as methyl cellosolve, ethyl cellosolve, methyl cellosolve acetate, and ethyl cellosolve acetate; propylene glycol solvents such as propylene glycol monomethyl ether, propylene glycol monobutyl ether, propylene glycol monomethyl ether acetate, propylene glycol dimethyl ether, and propylene glycol monoethyl ether acetate; ester solvents such as butyl acetate, amyl acetate, methyl lactate, ethyl lactate, methyl 3-methoxypropionate, and ethyl 3-ethoxypropionate; alcohol solvents such as hexanol and diacetone alcohol; ketone solvents such as cyclohexanone and methyl amyl ketone; ether solvents such as methyl phenyl ether and diethylene glycol dimethyl ether; highly polar solvents such as N,N-dimethylformamide and N-methylpyrrolidone, and mixtures thereof.

An appropriate amount of the solvent used is 1 to 20 times, especially 1 to 15 times, in weight, the total amount of solids (i.e., the mixture of alkali-soluble novolak resin and phenolic compound in which some hydroxyl groups are substituted with 1,2-naphthoquinonediazidosulfonyl ester groups).

In the inventive resist composition, optional additives such as dyes, pigments and surfactants may be compounded in minor amounts.

Another aspect of the invention provides a process for forming a resist pattern comprising the steps of (i) applying the aforementioned positive resist composition onto a substrate, (ii) exposing the applied resist through a photomask to light having a wavelength of 150 to 450 nm, and (iii) developing the exposed resist with a liquid developer.

In the patterning process of the invention, the positive resist composition is first applied onto a substrate to form a coating. The substrate may be a silicon wafer or quartz substrate, for example. The application may employ a well-known lithographic technique. For example, the composition can be applied by such a conventional technique as dipping, spin coating or roll coating. The coating weight may be selected in accordance with the intended purpose although a coating thickness of 0.5 to 20 μm is preferred.

For efficiency of photo-curing reaction, the coating may be preheated to evaporate off the solvent and the like. Preheating may be done at 80 to 120° C. for about 50 to 300 seconds.

Through a photomask, the coating is then exposed to light having a wavelength of 150 to 450 nm for curing. The photomask may be a mask having a desired pattern cut out, for example. The photomask is preferably made of a material capable of shielding the light having a wavelength of 150 to 450 nm, for example, chromium.

The light having a wavelength of 150 to 450 nm is radiation of varying wavelength typically emitted by a radiation generating device, such as UV radiation like g- and i-lines and deep UV radiation of 248 nm or 198 nm, and electron beams. An appropriate exposure is in the range of 10 to 500 mJ/cm$^2$.

If necessary, for enhancing development sensitivity, the cured resist may be subjected to heat treatment. Such post-cure heat treatment may be done at 90 to 130° C. for about 50 to 300 seconds.

Following the curing, the resist is developed with a liquid developer. The preferred developer is an aqueous solution of tetramethylammonium hydroxide or potassium hydroxide. Development may be carried out by a conventional technique, such as by immersing the cured resist in the developer. This may be optionally cleaned, dried or otherwise processed, yielding a cured resist film having the desired pattern.

EXAMPLE

Synthesis Examples, Working Examples and Comparative Examples are given below for further illustrating the invention although the invention is not limited thereto. Note that Mw is a weight average molecular weight and Mw/Mn is a dispersity.

Synthesis Example 1

A three-necked flask equipped with a stirrer, condenser and thermometer was charged with 129.8 g (1.20 mol) of p-cresol, 64.8 g (0.60 mol) of m-cresol, 24.4 g (0.20 mol) of p-xylenol, 97.4 g (1.04 mol) of 37 wt % formaldehyde in water, and 0.60 g (4.80×10$^{-3}$ mol) of oxalic acid dehydrate as a polycondensation catalyst. The flask was placed in an oil bath to keep its internal temperature at 100° C. while polycondensation reaction was carried out for one hour. After the completion of reaction, 1000 ml of methyl isobutyl ketone (MIBK) was added to the reaction solution, which was stirred for 30 minutes. Thereafter, the water layer was separated off, and the product extracted in the MIBK layer was washed with 600 ml of deionized water. Washing and separation was repeated 5 times. This was followed by vacuum stripping at 150° C. and 4 mmHg on an evaporator, yielding 174 g of the polycondensation product, novolak resin A (Mw=2,800, Mw/Mn=4.5).

Synthesis Example 2

In a 1-liter beaker, the novolak resin obtained in Synthesis Example 1 was dissolved in 696 g of methyl alcohol. Then 242 g of deionized water was added to the solution whereupon a high molecular weight fraction precipitated. The precipitate was taken out by decantation and dried, obtaining 125 g of a novolak resin B having a controlled molecular weight and dispersity (Mw=3,600, Mw/Mn=3.6).

Synthesis Examples 3 and 4

Resins were synthesized as in Synthesis Example 1 aside from using the reactants shown in Table 1. There were obtained 157 g of novolak resin C (Mw=4,100, Mw/Mn=3.2) and 186 g of novolak resin D (Mw=3,800, Mw/Mn=3.8).

Table 1 shows the molar ratio of phenols used in the synthesis of novolak resins A to D as well as Mw and Mw/Mn thereof. It is noted that measurement of Mw was carried out using a GPC column system (two G-2000H6 tubes, one G-3000H6 tube, and one G-4000H6 tube) by Toso Co., Ltd. and eluting solvent THF at a flow rate of 1.5 ml/min and a column temperature of 40° C.

TABLE 1

| Synthesis Example | Alkali-soluble novolak resin | Molar ratio of phenols charged | Mw | Mw/Mn |
|---|---|---|---|---|
| 1 | A | m-cresol/p-cresol/p-xylenol = 30/60/10 | 2,800 | 4.5 |
| 2 | B | m-cresol/p-cresol/p-xylenol = 30/60/10 | 3,600 | 3.6 |
| 3 | C | m-cresol/p-cresol/2,3,5-trimethylphenol = 30/60/10 | 4,100 | 3.2 |
| 4 | D | m-cresol/p-cresol = 45/55 | 3,800 | 3.8 |

Synthesis Example 5

Under light-shielded condition, a three-necked flask equipped with a stirrer, dropping funnel, condenser and thermometer was charged with 100 g (0.823 mol) of novolak resin A obtained in Synthesis Example 1, 5.00 g (0.013 mol) of bis(4-hydroxy-2,3,5-trimethylphenyl)-4-hydroxyphenylmethane, and 7.86 g (0.029 mol) of 1,2-naphthoquinonediazido-5-sulfonyl chloride, which were dissolved in 400 ml of dioxane. Then 3.11 g (0.031 mol) of triethylamine was added dropwise at such a rate that the internal temperature might not exceed 30° C. The reaction solution was then ripened for one hour and poured into 5000 ml of 0.1N aqueous hydrochloric acid, whereupon a re-precipitate was separated by filtration. It was dissolved in 800 g of ethyl acetate, washed with water and separated. The solvent was removed by vacuum stripping at 40° C., yielding 111 g of a positive resist composition.

Synthesis Example 6

The procedure of Synthesis Example 5 was repeated except that 100 g (0.823 mol) of novolak resin B, 8.00 g (0.021 mol) of bis(4-hydroxy-2,3,5-trimethylphenyl)-4-hydroxyphenylmethane, 9.07 g (0.034 mol) of 1,2-naphthoquinonediazido-5-sulfonyl chloride, and 3.59 g (0.035 mol) of triethylamine were used. There was obtained 115 g of a positive resist composition.

Synthesis Example 7

The procedure of Synthesis Example 5 was repeated except that 100 g (0.823 mol) of novolak resin B, 24.00 g (0.064 mol) of bis(4-hydroxy-2,3,5-trimethylphenyl)-4-hydroxyphenylmethane, 9.53 g (0.036 mol) of 1,2-naphthoquinonediazido-5-sulfonyl chloride, and 3.77 g (0.037 mol) of triethylamine were used. There was obtained 130 g of a positive resist composition.

Synthesis Example 8

The procedure of Synthesis Example 5 was repeated except that 100 g (0.823 mol) of novolak resin D, 8.00 g (0.021 mol) of bis(4-hydroxy-2,3,5-trimethylphenyl)-4-hydroxyphenylmethane, 9.17 g (0.034 mol) of 1,2-naphthoquinonediazido-5-sulfonyl chloride, and 3.63 g (0.036 mol) of triethylamine were used. There was obtained 114 g of a positive resist composition.

Synthesis Example 9

The procedure of Synthesis Example 5 was repeated except that 100 g (0.823 mol) of novolak resin B, 9.17 g (0.034 mol) of 1,2-naphthoquinonediazido-5-sulfonyl chloride, and 3.63 g (0.036 mol) of triethylamine were used. There was obtained 106 g of a positive resist composition.

Table 2 shows the type of novolak resin, the proportion (wt %) of the phenolic compound monomer mixed relative to the novolak resin, and the substitution (mol %) of 1,2-naphthoquinonediazidosulfonyl ester (NQD) relative to overall hydroxyl groups in Synthesis Examples 5 to 9.

TABLE 2

| Synthesis Example | Novolak resin | Monomer proportion (wt %) | NQD substitution (mol %) |
|---|---|---|---|
| 5 | A | 5 | 3.5 |
| 6 | B | 8 | 4.0 |
| 7 | B | 24 | 4.0 |
| 8 | D | 8 | 4.0 |
| 9 | B | — | 4.1 |

Synthesis Example 10

Esterification of Phenolic Monomer

The procedure of Synthesis Example 5 was repeated except that 10.0 g (0.027 mol) of bis(4-hydroxy-2,3,5-trimethylphenyl)-4-hydroxyphenylmethane, 10.7 g (0.040 mol) of 1,2-naphthoquinonediazido-5-sulfonyl chloride, and 4.0 g (0.04 mol) of triethylamine were used. There was obtained 15.4 g of a 1,2-naphthoquinonediazido-5-sulfonyl ester of bis(4-hydroxy-2,3,5-trimethylphenyl)-4-hydroxyphenylmethane (NQD substitution 50 mol %).

Example 1

10 g of the positive resist composition obtained in Synthesis Example 5 was dissolved in 25 g of ethyl lactate and 0.013 g of a surfactant X-70-093 (Shin-Etsu Chemical Co., Ltd.). The mixture was passed through a membrane filter having a pore diameter of 0.2 μm, obtaining a resist solution.

The resist solution was then applied onto a 6-inch bare silicon wafer by means of a spinner and pre-baked on a hot plate at 100° C. for 120 seconds to form a resist coating of 5.0 μm thick. The resist coating was exposed to light using an i-line stepper (NSR-1755i7 by Nikon Corporation, NA=0.5), developed and rinsed with deionized water. The resulting pattern was evaluated by observing a 0.5-μm isolated space pattern under SEM (Hitachi, Ltd.). Resolution was determined in terms of rectangularity of pattern top, perpendicularity of pattern sidewalls, and the presence of resist residues or scum in space areas.

Examples 2 to 4

As in Example 1, resist solutions were prepared using the alkali-soluble novolak resins of Synthesis Examples 6 to 8 and the patterns resulting therefrom were evaluated.

Comparative Example 1

8.62 g of the positive resist composition obtained in Synthesis Example 9 was dissolved in 25 g of ethyl lactate, 0.012 g of a surfactant X-70-093 (Shin-Etsu Chemical Co., Ltd.), and 0.8 g of bis(4-hydroxy-2,3,5-trimethylphenyl)-4-hydroxyphenylmethane. The mixture was passed through a membrane filter having a pore diameter of 0.2 μm, obtaining a resist solution. As in Example 1, a resist pattern was formed and evaluated.

Comparative Example 2

8.62 g of the positive resist composition obtained in Synthesis Example 9 was dissolved in 25 g of ethyl lactate, 0.012 g of a surfactant X-70-093 (Shin-Etsu Chemical Co., Ltd.), and 0.8 g of the 1,2-naphthoquinonediazido-5-sulfonyl ester of bis(4-hydroxy-2,3,5-trimethylphenyl)-4-hydroxy-phenylmethane obtained in Synthesis Example 10. The mixture was passed through a membrane filter having a pore diameter of 0.2 μm, obtaining a resist solution. As in Example 1, a resist pattern was formed and evaluated.

The results are shown in Table 3.

TABLE 3

| | Rectangularity of pattern top | Perpendicularity of pattern sidewalls | Presence of scum |
|---|---|---|---|
| Example 1 | film slimmed, somewhat forward tapered | enlarged at intermediate | no scum |
| Example 2 | fully rectangular | fully perpendicular | no scum |
| Example 3 | film slimmed, somewhat forward tapered | fully perpendicular | no scum |
| Example 4 | no film slimming, somewhat forward tapered | fully perpendicular | scum found |
| Comparative Example 1 | no film slimming, somewhat forward tapered | somewhat reverse tapered | no scum |
| Comparative Example 2 | fully rectangular | somewhat forward tapered | scum found |

Although some preferred embodiments have been described, many modifications and variations may be made thereto in light of the above teachings. It is therefore to be understood that the invention may be practiced otherwise than as specifically described without departing from the scope of the appended claims.

Japanese Patent Application No. 2003-321824 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A positive resist composition comprising as a base resin a mixture of 100 parts by weight of an alkali-soluble novolak resin comprising recurring units of the structural formula (1) and 1 to 20 parts by weight of a phenolic compound of the structural formula (2), wherein a mixture of the alkali-soluble novolak resin and the phenolic compound is subjected to esterification with a 1,2-naphthoquinonediazidosulfonic acid compound whereby the hydrogen atoms of all hydroxyl groups are substituted in a proportion of 0.03 to 0.05 mol per hydrogen atom with 1,2-naphthoquinonediazidosulfonyl ester groups,

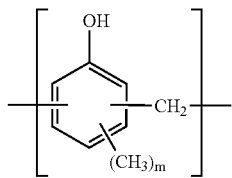
(1)

wherein m is an integer of 0 to 3,

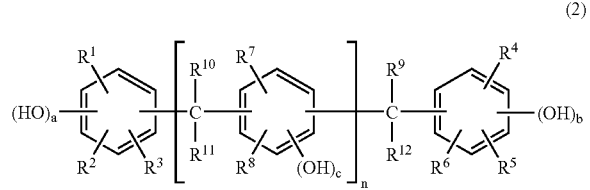
(2)

wherein $R^1$ to $R^8$ are each independently hydrogen, a straight, branched or cyclic alkyl group having 1 to 6 carbon atoms, or a straight, branched or cyclic alkoxyl group having 1 to 6 carbon atoms, $R^9$ to $R^{11}$ are each independently hydrogen or a straight, branched or cyclic alkyl group having 1 to 6 carbon atoms, $R^{10}$ and $R^{11}$, taken together, may form a ring with the carbon atom to which they are bonded, $R^2$ is hydrogen, a straight alkyl group having 1 to 6 carbon atoms, or a group of the formula (3):

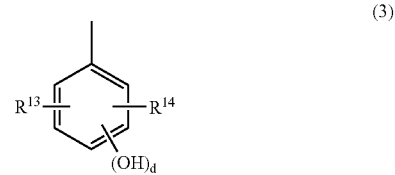
(3)

wherein $R^{13}$ and $R^{14}$ are each independently hydrogen, a straight, branched or cyclic alkyl group having 1 to 6 carbon atoms, or a straight, branched or cyclic alkoxyl group having 1 to 6 carbon atoms, d is an integer of 1 to 3, $R^{12}$ and $R^9$, taken together, may form a ring of 3 to 6 carbon atoms with the carbon atom to which they are bonded, a and b each are an integer of 1 to 3, c is an integer of 0 to 3, and n is an integer of 0 to 3.

2. The positive resist composition of claim 1, wherein said alkali-soluble novolak resin has a weight average molecular weight of 2,000 to 4,000 based on polystyrene standards.

3. The positive resist composition of claim 1, wherein said alkali-soluble novolak resin has a dispersity of 3.0 to 5.0.

4. The positive resist composition of claim 1, wherein said alkali-soluble novolak resin has been prepared using m-cresol, p-cresol and 2,5-xylenol as starting reactants.

5. A patterning process comprising the steps of:
    (i) applying the positive resist composition of any one of claims 1 to 4 on to a substrate,
    (ii) exposing the applied resist through a photomask to light having a wavelength of 150 to 450 nm, and
    (iii) developing the exposed resist with a liquid developer.

6. The positive resist composition of claim 1, wherein the hydrogen atoms of all hydroxyl groups are substituted in a proportion of 0.03 to 0.04 mol per hydrogen atom with 1,2-naphthoquinonediazidosulfonyl ester groups.

* * * * *